United States Patent
Hanjani

(10) Patent No.: US 8,731,345 B2
(45) Date of Patent: May 20, 2014

(54) SYSTEM FOR MANAGING THERMAL CONDUCTION ON OPTICAL DEVICES

(75) Inventor: Amir Hanjani, Cincinnati, OH (US)

(73) Assignee: Kotura, Inc., Montery Park, CA (US)

( * ) Notice: Subject to any disclaimer, the term of this patent is extended or adjusted under 35 U.S.C. 154(b) by 0 days.

(21) Appl. No.: 13/507,491

(22) Filed: Jul. 3, 2012

(65) Prior Publication Data

US 2013/0156368 A1 Jun. 20, 2013

Related U.S. Application Data

(63) Continuation-in-part of application No. 13/374,242, filed on Dec. 15, 2011, now abandoned.

(51) Int. Cl.
  *G02B 6/12* (2006.01)
  *G02B 6/26* (2006.01)
  *G02B 6/10* (2006.01)

(52) U.S. Cl.
  USPC ............................... 385/14; 385/15; 385/129

(58) Field of Classification Search
  USPC .......................................................... 385/14
  See application file for complete search history.

(56) References Cited

U.S. PATENT DOCUMENTS

| | | | | |
|---|---|---|---|---|
| 5,184,247 A * | 2/1993 | Schimpe | ...................... | 359/344 |
| 5,307,237 A * | 4/1994 | Walz | ............................. | 361/718 |
| 6,058,013 A * | 5/2000 | Christopher et al. | ......... | 361/704 |
| 6,426,686 B1 * | 7/2002 | Douriet et al. | ................ | 333/247 |
| 6,704,488 B2 * | 3/2004 | Lavallee et al. | ............... | 385/137 |
| 6,808,798 B2 * | 10/2004 | Tobita | ........................ | 428/298.1 |
| 6,921,215 B2 * | 7/2005 | Catchmark et al. | ............. | 385/92 |
| 6,922,422 B2 * | 7/2005 | Peters et al. | .................... | 372/36 |
| 6,941,043 B1 * | 9/2005 | Major et al. | .................... | 385/37 |
| 7,054,159 B2 * | 5/2006 | Nakamura | ..................... | 361/719 |
| 7,200,296 B2 * | 4/2007 | Kish et al. | ........................ | 385/14 |
| 7,269,017 B2 * | 9/2007 | Berlin et al. | ................... | 361/719 |
| 7,298,941 B2 * | 11/2007 | Palen et al. | ..................... | 385/33 |
| 7,457,491 B2 * | 11/2008 | Chen et al. | ...................... | 385/14 |
| 7,667,311 B2 * | 2/2010 | Furuyama et al. | ............. | 257/678 |
| 2002/0075105 A1 * | 6/2002 | Douriet et al. | ................ | 333/247 |
| 2002/0191887 A1 * | 12/2002 | Bidnyk | ........................... | 385/15 |
| 2002/0197013 A1 * | 12/2002 | Liu et al. | .......................... | 385/37 |
| 2003/0063889 A1 * | 4/2003 | Lavallee et al. | ............... | 385/137 |
| 2003/0086465 A1 * | 5/2003 | Peters et al. | .................... | 372/50 |

(Continued)

OTHER PUBLICATIONS

Manno, Vincent P. et al., "Experimental Characterization of Board Conduction Effects", Semiconductor Thermal Measurement and Management Symposium, 1993. Semi-Therm IX., Ninth Annual IEEE, pp. 127-135.*

(Continued)

*Primary Examiner* — Rhonda Peace
(74) *Attorney, Agent, or Firm* — Gavrilovich, Dodd & Lindsey, LLP

(57) ABSTRACT

The system includes an optical device having both optical components and one or more waveguides on a base. The system also includes a heat sink and a zone definer contacting the base and the heat sink. The zone definer is configured to conduct thermal energy from the optical device to the heat sink. The zone definer includes a thermal insulator having a lower thermal conductivity than both the heat sink and the base. The zone definer also includes a thermal via that extends through the thermal insulator. A via medium is positioned in the thermal via and has a higher thermal conductivity than the thermal insulator. The via medium is located under one of the optical components.

38 Claims, 8 Drawing Sheets

(56) References Cited

U.S. PATENT DOCUMENTS

| | | | |
|---|---|---|---|
| 2003/0095736 A1* | 5/2003 | Kish et al. | 385/14 |
| 2003/0161603 A1* | 8/2003 | Nadeau et al. | 385/137 |
| 2004/0152240 A1* | 8/2004 | Dangelo | 438/122 |
| 2005/0018720 A1* | 1/2005 | Kish et al. | 372/20 |
| 2005/0084219 A1* | 4/2005 | Catchmark et al. | 385/92 |
| 2005/0230795 A1* | 10/2005 | Furuyama et al. | 257/678 |
| 2006/0239605 A1* | 10/2006 | Palen et al. | 385/14 |
| 2006/0278901 A1* | 12/2006 | Dangelo et al. | 257/276 |
| 2008/0185733 A1* | 8/2008 | Furuyama et al. | 257/777 |
| 2012/0092833 A1* | 4/2012 | Chang et al. | 361/710 |

OTHER PUBLICATIONS

Haynes, W. M., ed. CRC Handbook of Chemistry and Physics. 93rd Edition. Internet Version, 2013. Section 12, pp. 80-93.*

* cited by examiner

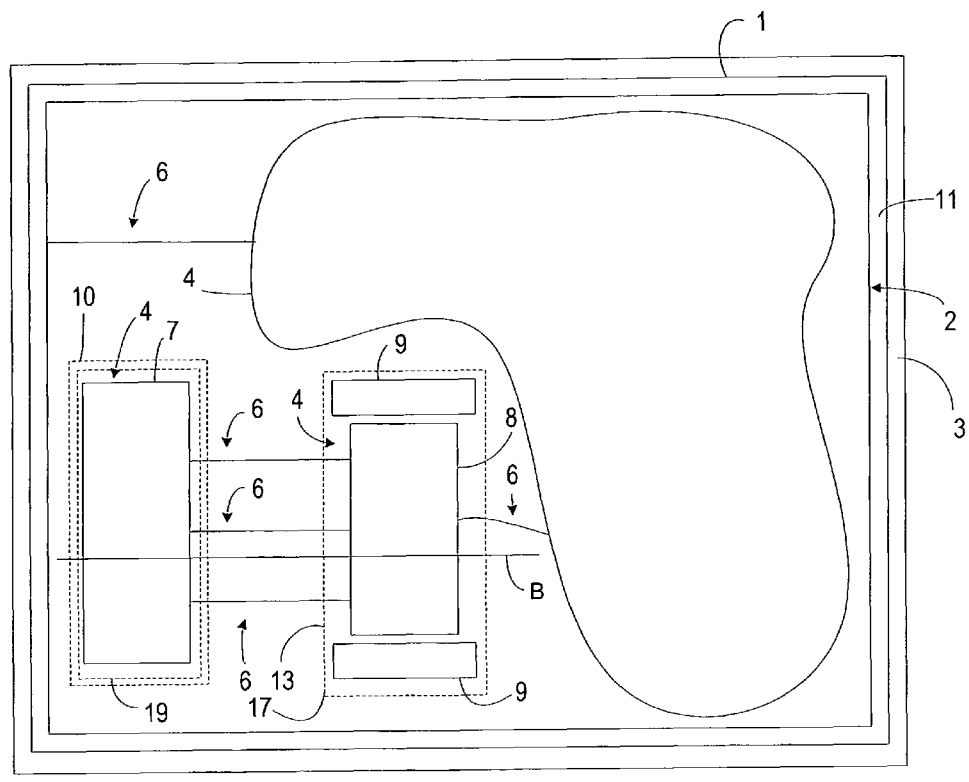
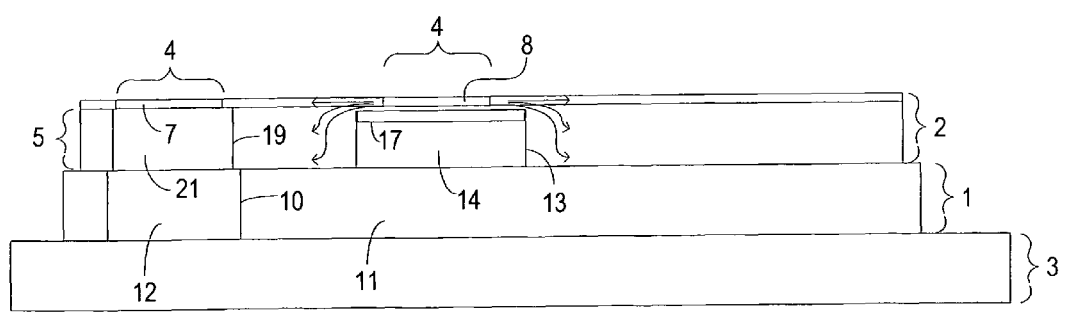
Figure 2A
Figure 2B

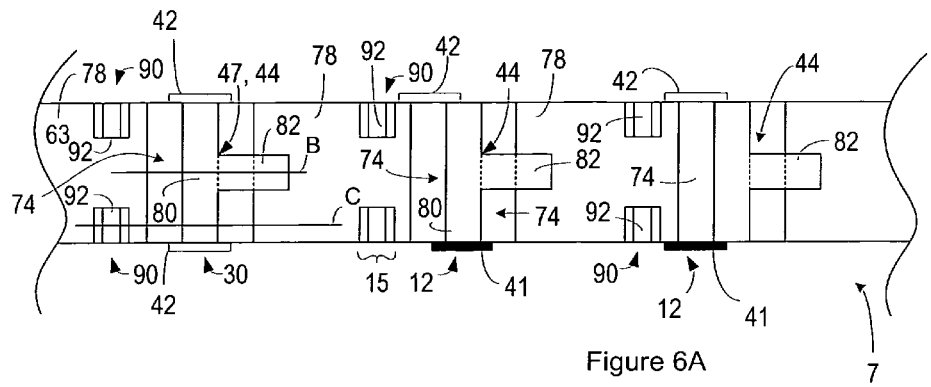
Figure 6A
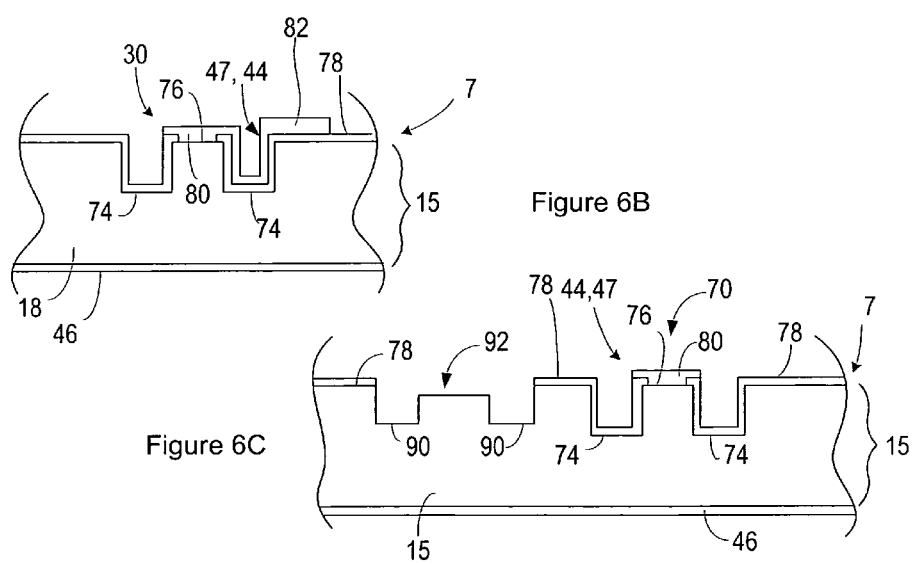
Figure 6B
Figure 6C
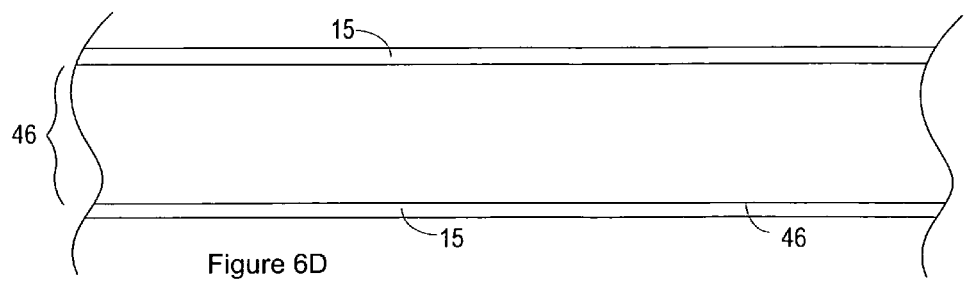
Figure 6D

SYSTEM FOR MANAGING THERMAL CONDUCTION ON OPTICAL DEVICES

RELATED APPLICATIONS

This Application is a Continuation-in-Part of U.S. patent application Ser. No. 13/374,242, filed on Dec. 15, 2011 now abandoned, entitled "System for Managing Thermal Conduction on Optical Devices," and incorporated herein in its entirety.

FIELD

The present invention relates to optical devices and more particularly to management of thermal conduction in optical devices.

BACKGROUND

Planar optical devices include a variety of optical components on a single substrate. These devices are often plagued with thermal management issues. For instance, these devices often include a first component that injects large and varying amounts of thermal energy into the device and a second component that requires a stable temperature in order to operate as desired. The optical device performance drops when the injection of thermal energy into the device by the first component de-stabilizes the temperature of the second component. As a result, these device need improved methods for thermal management.

SUMMARY

The system includes an optical device having both optical components and one or more waveguides on a base. The system also includes a heat sink and a zone definer contacting the base and the heat sink. The zone definer is configured to conduct thermal energy from the optical device to the heat sink. The zone definer includes a thermal insulator having a lower thermal conductivity than both the heat sink and the base. The zone definer also includes a thermal via that extends through the thermal insulator. A via medium is positioned in the thermal via and has a higher thermal conductivity than the thermal insulator. The via medium is located under one of the optical components.

In some instances, the device includes a cavity in the base. A cavity medium is the medium in the cavity and has a thermal conductivity that is less than the portions of the base that defines the cavity. The cavity medium is positioned under one or more of the components.

In some instances, the components include heat-generating components and temperature sensitive components. The heat-generating components generate heat during operation. Temperature sensitive components have a performance that changes in response to temperature. The thermal via is positioned under one or more of the heat-generating components and the cavity is positioned under one or more of the temperature sensitive components.

BRIEF DESCRIPTION OF THE FIGURES

FIG. 1A is a topview of the optical system.

FIG. 1B is a cross section of the system shown in FIG. 1A. The cross section shown in FIG. 1B is taken along the line labeled B in FIG. 1A.

FIG. 2A and FIG. 2B illustrate an optical system. FIG. 2A is a topview of the optical system.

FIG. 2B is a cross section of the system shown in FIG. 2A. The cross section shown in FIG. 2B is taken along the line labeled B in FIG. 2A.

FIG. 4A is a topview of the system.

FIG. 4B is a cross-section of the system shown in FIG. 4A taken through one of the waveguides on the device.

FIG. 4C is a cross section of the system shown in FIG. 4A taken along the line labeled C in FIG. 4A.

FIG. 5A is a topview of the optical device.

FIG. 5B is a perspective view of a portion of the optical device shown in FIG. 5A.

FIG. 6A through FIG. 6D illustrate a laser bar that is suitable for use with an optical device constructed according to FIG. 5A through FIG. 5B. FIG. 6A is a bottom view of the laser bar.

FIG. 6B is a cross-section of the laser bar shown in FIG. 6A taken along the line labeled B in FIG. 6A.

FIG. 6C is a cross-section of the laser bar shown in FIG. 6A taken along the line labeled C in FIG. 6A.

FIG. 6D is a topview of the laser bar.

DESCRIPTION

Figure 1A:
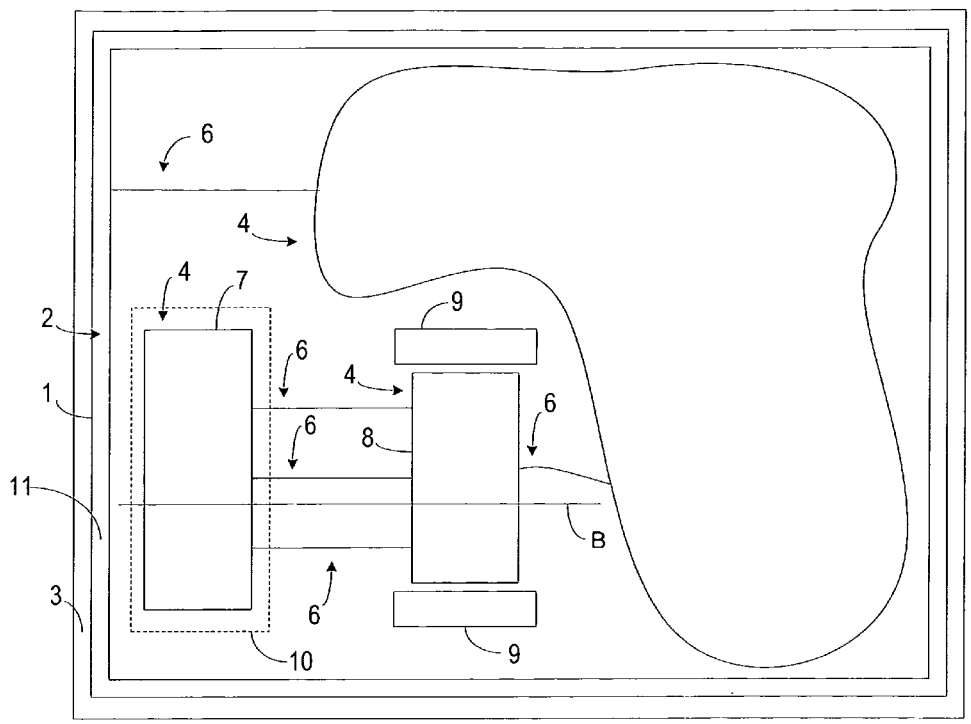
FIG. 1A and FIG. 1B illustrate an optical system.

An optical device includes optical components on a common base. A portion of the optical components generate heat during operating while another portion of the devices are temperature sensitive components that are preferably kept at a particular temperature or in a particular range of temperatures during operation. In general, localized heaters are used to keep the temperature sensitive components at a temperature above room temperature and/or above maximum ambient temperature.

The device is part of a system that includes a zone definer between the optical device and a heat sink. The zone definer conducts thermal energy from the optical device to the heat sink where the thermal energy is dissipated. The zone definer includes one or more thermal vias extending through a thermal insulator. The medium in the thermal via has a thermal conductivity that exceeds the thermal conductivity of the thermal insulator. As a result, the thermal via provides a pathway through which thermal energy is easily conducted through the zone definer. The thermal via is located under the heat-generating component and accordingly conducts heat-generated by the heat-generating component to the heat sink.

The thermal insulator included in the zone definer is located under the temperature sensitive component and any associated heaters. As a result, the thermal insulator helps to constrain the thermal energy applied to the device by the heaters in the area around the temperature sensitive component. Constraining the thermal energy to the temperature sensitive component and surrounding areas reduces the amount of heat that the heaters must apply to the device in order to maintain the temperature sensitive component at the desired temperature. As a result, the zone definer allows the thermal energy from the heat-generating devices to be dissipated while reducing the power requirements of the temperature sensitive components.

In some instances, the power requirements of the device are further reduced by the location of a back cavity under each of the temperature sensitive component and/or under one or more of the temperature sensitive components. For instance, the device can include a back cavity that extends from the bottom of the base, part way into the base or even through the base. In some instances, the back cavity extends into the base by more than 20%, 50%, or 70% of the thickness of the base. As a result, the back cavity reduces the thickness of the portion of the base located under the temperature sensitive component. Additionally, the medium inside the back cavity has a thermal conductivity that is less than the thermal conductivity of the base. The reduced thermal conductivity of the cavity medium combined with the reduced thickness of the base means that any local heaters have a smaller space that needs to be kept at the desired temperature. Since a smaller space must be kept at the desired temperature, less energy must be applied to the device and the power requirements of the device are reduced.

Figure 1B:
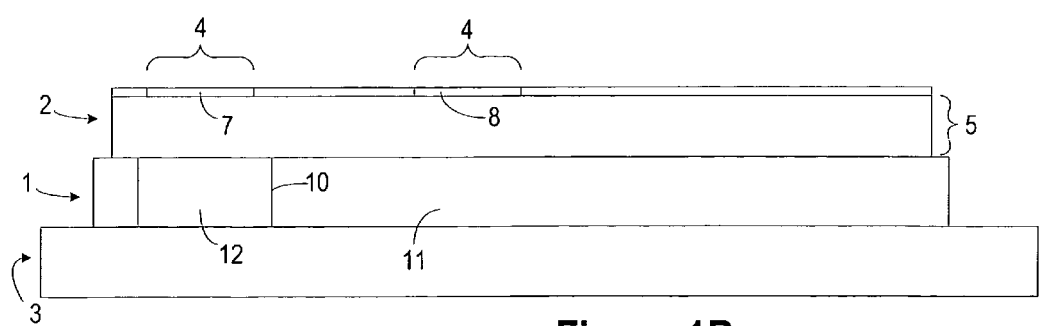

FIG. 1A and FIG. 1B illustrate an optical system. FIG. 1A is a topview of the optical system. FIG. 1B is a cross section of the system shown in FIG. 1A. The cross section shown in FIG. 1B is taken along the line labeled B in FIG. 1A. The system includes a zone definer 1 between an optical device 2 and a heat sink 3.

The optical device 2 includes multiple optical components 4 positioned on a base 5 that includes or consists of a substrate. Additionally, the optical device 2 includes one or more waveguides 6 that guide light signals between different optical components 4. Alternately, one or more of the waveguides 6 can guide light signals to and/or from an optical fiber positioned at an edge of the device to one of the optical components 4.

Examples of optical components 4 that can be included on the device include, but are not limited to, lasers, laser chips, lasers bars, light signal multiplexers, light signal demultiplexers, light signal combiners, light signal splitters, light signal couplers, light sensors, optical attenuators, optical modulators, amplifiers, filters, reflective gratings, circulators, etc.

One or more of the optical components 4 on the device is a heat-generating component 7. During operation, heat-generating components 7 generate heat that is injected into the device in the form of thermal energy. In one example, energy that allows a heat-generating component 7 to act on light within the component is typically applied to the component. The applied energy at least partially acts as the source of thermal energy generated by the component. For instance, electrical energy applied to these components during operation is generally a source of thermal energy that is generated by these components and is injected into the device. An example of these types of optical components 4 is a solid state laser source that is pumped by electrical energy. During operation of a laser source, a form of energy such as electrical energy is applied to the laser source in order to pump the laser. This application of energy to the laser source results in an injection of thermal energy into the optical device 2 and accordingly increases the temperature of the portion of the optical device 2 around the laser source. A heat-generating component 7 can also generate heat as a result of absorbing energy. For instance, light sensors that operate by absorbing light and/or light signals carried by the device can also generate heat in response to absorbing light energy.

A portion of the optical components 4 on the device are temperature sensitive components 8. Temperature sensitive components 8 are optical components 4 that are preferably kept at a particular temperature during operation. Examples of temperature sensitive components 8 include, but are not limited to, some variable optical attenuators, some modulators, and some multiplexers/demultiplexers such as echelle gratings.

The optical device 2 can include one or more temperature control devices that are each associated with one or more of the temperature sensitive components 8. The temperature control devices can be configured to keep one or more temperature sensitive components 8 at a particular temperature and/or within a particular range of temperatures. For instance, the device shown in FIG. 1A includes heaters 9 associated with the temperature sensitive component 8 in that the heat provided by the heaters 9 is intended to elevate the temperature of the temperature sensitive component 8. Because it is often not possible or desirable to place a localized heater 9 directly in contact with a temperature sensitive component 8 such as an echelle grating, the heater(s) 9 must be close enough that the zone where the temperature is increased extends beyond the temperature sensitive component 8. Accordingly, the heaters 9 shown in FIG. 1 are positioned on opposing sides of the temperature sensitive component 8 rather than directly in contact with the temperature sensitive component 8.

The device can also include one or more temperature sensors (not shown) that are each positioned to sense the temperature of the temperature sensitive component 8 itself and/or the temperature of a zone adjacent to the temperature sensitive component 8.

Electronics (not shown) can operate the heaters 9 and receive output from the one or more temperature sensors. The electronics can also adjust the level of electrical energy applied to each of the heaters 9 in response to the output received from the one or more temperature sensors in a feedback loop. For instance, in the event that the output from the one or more temperature sensors indicates that the temperature is above an upper threshold, the electronics can increase the heat being generated by the one or more heaters 9. Additionally or alternately, in the event that the output from the one or more temperature sensors indicates that the temperature is below a lower threshold, the electronics can decrease the level of heat being generated by the one or more heaters 9. In one example, the electronics are configured to maintain the temperature of the temperature sensitive component 8 at a temperature or in a temperature range that is above the maximum temperature of the ambient atmosphere in which the temperature sensitive component 8 is positioned.

Suitable heaters 9 for use on planar optical devices 2 include, but are not limited to, resistive heating elements. For instance, a suitable heater 9 can be a layer of electrically conducting material with a temperature that increases in response to the electronics applying an electrical current across the material. Suitable temperature sensors include, but are not limited to, thermocouples, thermistors, resistive thermal devices (RTDs), and semiconductor temperature sensors.

As noted above, thermal energy injected into the optical device from certain components (including optical components) can affect the performance of other optical optical components 4 on the device. This issue is addressed by locating the zone definer 1 between the device and the heat sink 3 such that the zone definer 1 contacts both the base 5 and the heat sink 3 such that the zone definer 1 conducts thermal energy from the optical device 2 to the heat sink 3. The heat sink 3 is a block or plate made of a material that readily conducts the thermal energy received from the zone definer 1.

The zone definer 1 includes one or more thermal vias 10 extending through a thermal insulator 11. The thermal via 10 is configured such that the via medium 12 (the medium in the thermal via 10) conducts thermal energy from the base 5 of the optical device 2 to the heat sink 3. For instance, the via medium 12 can contact both the base 5 and the heat sink 3.

The thermal insulator 11 has a thermal conductivity that is less than the base 5 of the device and also less than the thermal conductivity of the heat sink 3. In contrast, the via medium 12 (the medium in the thermal via 10) has a thermal conductivity that exceeds the thermal conductivity of the thermal insulator 11. In some instances, the medium in the thermal via 10 has a thermal conductivity that exceeds the thermal conductivity of the base 5.

Since the thermal conductivity of the thermal medium is higher than that of the thermal insulator 11, the thermal via 10 provides a pathway through which thermal energy is easily conducted through the zone definer 1. Accordingly, the via defines a thermal conduction zone in the zone definer 1. Since the thermal via 10 is not visually apparent from above the optical device 2, the location of the thermal via 10 is shown by the dashed lines in FIG. 1A. As is evident from these dashed lines, the thermal via 10 is located under the heat-generating component 7. For instance, a line extending in a perpendicular direction relative to an upper surface of the heat sink 3 can extend through the thermal via 10 before extending through the heat-generating component 7. Similarly, the thermal via 10 is between the heat-generating component 7 and the heat sink 3 in that a line perpendicular to an upper surface of the heat sink 3 can extend through both the thermal via 10 and the heat-generating component 7. As a result, heat-generated by the heat-generating component 7 is readily conducted through the thermal via 10 to the heat sink 3.

FIG. 1 shows the thermal via 10 located such that a projection of the thermal via 10 onto the heat-generating component 7 has the thermal via 10 surrounding the heat-generating component 7. However, in some instances, the thermal via 10 does not surround the heat-generating component 7 and is instead positioned under only a portion of the heat-generating component 7. Further, a thermal via 10 can be positioned under more than one optical component 4. When the thermal via 10 is positioned under more than one optical component 4, the thermal via 10 can surround each of the optical components 4 or only a portion of the optical components 4.

The thermal insulator 11 is located under the temperature sensitive component 8 and the heaters 9. As a result, the thermal insulator 11 helps to constrain the thermal energy applied to the device by the heaters 9 in the area around the temperature sensitive component 8. Constraining the thermal energy to the temperature sensitive component 8 and surrounding areas reduces the amount of heat that the heaters 9 must apply to the device in order to maintain the desired temperature. As a result, this arrangement reduces the power requirements of the device.

The via medium 12 can be surrounded by the thermal insulator 11. Alternately, the via medium 12 can be open to the edge of the zone definer 1. For instance, an edge of the via medium 12 can serve as an edge of the zone definer 1.

In some instances, the power requirements of the device can be further reduced by the location of a back cavity 13 under each of the temperature sensitive component 8 and/or under one or more of the temperature sensitive components 8. FIG. 2A and FIG. 2B illustrate the system of FIG. 1A and FIG. 1B but with the optical device 2 having a back cavity 13.

As is evident in FIG. 2B, the back cavity 13 extends into the base 5 from the bottom of the device. The back cavity 13 can extend from the bottom of the base 5 and part way into the base 5 or even through the base 5.

Since the back cavity 13 is not visually apparent from above the optical device 2, the location of the back cavity 13 is shown by the dashed lines in FIG. 2A. As will be discussed in more detail below, these dashed lines also define the location of a heat retention zone on the device. As is evident from FIG. 2A, the back cavity 13 is located under the temperature sensitive component 8. For instance, a line extending in a perpendicular direction relative to an upper surface of the heat sink 3 can extend through the back cavity 13 before extending through the temperature sensitive component 8. Similarly, the back cavity 13 is between the temperature sensitive component 8 and the heat sink 3 in that a line perpendicular to an upper surface of the heat sink 3 can extend through both the back cavity 13 and the temperature sensitive component 8. As a result, the back cavity 13 reduces the thickness of the portion of the device located under at least the temperature sensitive component 8. In the case of FIG. 2A and FIG. 2B, the back cavity 13 reduces the thickness of the portion of the device located under the temperature sensitive component 8.

As is evident from FIG. 2A, the back cavity 13 is located under heaters 9 associated with the temperature sensitive component 8. For instance, a line extending in a perpendicular direction relative to an upper surface of the heat sink 3 can extend through the back cavity 13 before extending through the heaters 9. Similarly, the back cavity 13 is between each of the heaters 9 and the heat sink 3. For instance, different lines that are each line perpendicular to an upper surface of the heat sink 3 can each extend through both the back cavity 13 and a different one of the heaters 9. As a result, the back cavity 13 reduces the thickness of the portion of the device located under the heaters 9. In the case of FIG. 2A and FIG. 2B, the back cavity 13 reduces the thickness of the portion of the device located under each of the heaters 9.

The system can also include one or more cavity heaters 17 located in the back cavity 13. For instance, the system of FIG. 2A and FIG. 2B includes a cavity heater 17 located in the back cavity 13. Since the cavity heater 17 is not visually apparent from above the optical device 2, the location of the cavity heaters 17 is shown by the dashed lines in FIG. 2A. At least a portion of the cavity heater 17 is located under the temperature sensitive component 8. For instance, a line extending in a perpendicular direction relative to an upper surface of the heat sink 3 can extend through the back cavity 13 and the cavity heater before extending through the temperature sensitive component 8. Additionally, the cavity heater 17 can contact the top of the back cavity to permit the cavity heater 17 to apply heat to the temperature sensitive component 8. For instance, the cavity heater 17 can contact a portion of the base 5 located under the temperature sensitive component 8.

Although FIG. 2A and FIG. 2B show the system including both heaters 9 and one or more cavity heater(s) 17, the system can include one or more heaters 9 and exclude cavity heater(s) 17, or can include only one or more cavity heater(s) 17 and exclude heaters 9, or can exclude both heaters 9 and cavity heater(s) 17. Suitable heaters 9 or cavity heater(s) 17 for use with the system include, but are not limited to, resistive heating elements. For instance, a suitable heater 9 and/or or cavity heater 17 can be a layer of electrically conducting material with a temperature that increases in response to the electronics applying an electrical current across the material. As discussed above electronics can use output from one or more temperature sensors to control the heater 9 and/or or cavity heater 17 such that the temperature sensitive component 8 is maintained at particular temperature or in a range of temperatures. In one example, the electronics are configured to maintain the temperature of the temperature sensitive component 8 at a temperature or in a temperature range that is above the maximum temperature of the ambient atmosphere in which the temperature sensitive component 8 is positioned.

The cavity medium 14 (the medium inside the back cavity 13) has a thermal conductivity that is less than the thermal conductivity of the base 5. For instance, the cavity medium 14 can be air. The reduced thermal conductivity of the cavity medium 14 combined with the reduced thickness of the base 5 means that the heaters 9 and/or or cavity heater 17 have a smaller space that needs to be kept at the temperature desired for the temperature sensitive component 8. Since a smaller space must be kept at the desired temperature, less energy must be applied to the device in order to achieve the desired temperature. Accordingly, the back cavity 13 reduces the power requirements of the device.

The back cavity 13 also defines a heat retention zone on the device. As a shown by the arrows in FIG. 2B, once the thermal energy is conducted away from the temperature sensitive component 8 and out of the space over the back cavity 13 (the heat retention zone), the thermal energy can travel down into the base 5. Accordingly, once the thermal energy is conducted away from the heat retention zone, the space available for diffusion of the thermal energy increases. This increase in diffusion space increases the rate at which the thermal energy diffuses. The enhanced diffusion of this thermal energy accelerates the temperature drop that occurs traveling away from the heat retention zone. As a result, the back cavity 13 reduces the effects of the thermal energy on optical components 4 outside of the heat retention zone and effectively increases the thermal isolation of the temperature sensitive component 8.

The device 2 can also optionally include one or more thermal cavities that are each under one or more heat-generating components. For instance, FIG. 2A and FIG. 2B illustrate a thermal cavity 19 positioned under the heat-generating component 7. Since the thermal cavity 19 is not visually apparent from above the optical device 2, the location of the thermal cavity 19 13 is shown by the dashed lines in FIG. 2A. As is evident in FIG. 2B, the thermal cavity 19 extends into the base 5 from the bottom of the device 2. FIG. 2B shows the thermal cavity 19 extending through the base 5. However, the thermal cavity 19 can extend part way into the base 5 so a portion of the base is between the thermal cavity 19 and the heat-generating component 7. In some instances, the thermal cavity 19 extends into the base by more than 30%, 60%, or 80% of the thickness of the base.

The thermal cavity 19 is positioned under all or a portion of the heat-generating component 7. For instance, a line extending in a perpendicular direction relative to an upper surface of the heat sink 3 can extend through the thermal cavity 19 before extending through the heat-generating component 7. Additionally, the thermal cavity 19 is aligned with the thermal via. For instance, a line extending in a perpendicular direction relative to an upper surface of the heat sink 3 can extend through the via medium 12 and the thermal cavity 19 before extending through the heat-generating component 7.

A thermally conductive medium 21 is positioned in the thermal cavity 19. The thermally conductive medium 21 has a thermal conductivity that exceeds the thermal conductivity of all or a portion of the base 5 that defines the thermal cavity 19. The elevated thermal conductivity of the thermally conductive medium 21 relative to the base combined with the alignment of the thermal cavity 19 with the thermal via 10 provides a pathway through which thermal energy is easily conducted from the heat-generating component 7, through the zone definer 1 and to the heat sink 3.

FIG. 2A shows the thermal cavity 19 located such that a projection of the back cavity 13 onto the top of the optical device 2 has the thermal cavity 19 surrounding the heat-generating component 7. However, in some instances, the thermal cavity 19 does not surround the heat-generating component 7 and is instead positioned under only a portion of the heat-generating component 7. Additionally or alternately, FIG. 1A and FIG. 2A each shows the thermal via 10 located such that a projection of the thermal via 10 onto the top of the optical device 2 has the thermal via 10 surrounding the heat-generating component 7. However, in some instances, the thermal via 10 does not surround the heat-generating component 7 and is instead positioned under only a portion of the heat-generating component 7.

FIG. 2A shows the back cavity 13 located such that a projection of the back cavity 13 onto the top of the optical device 2 has the back cavity 13 surrounding the temperature sensitive component 8. However, in some instances, the back cavity 13 does not surround the temperature sensitive component 8 and is instead positioned under only a portion of the temperature sensitive component 8. Further, a back cavity 13 can be positioned under more than one of the optical components 4. When the back cavity 13 is positioned under more than one optical component 4, the back cavity 13 can surround each of the optical components 4 or only a portion of the optical components 4.

FIG. 2A shows the back cavity 13 located such that a projection of the back cavity 13 onto the top of the optical device 2 has the back cavity 13 surrounding the heater(s) associated with the temperature sensitive component 8. However, in some instances, the back cavity 13 does not surround the heaters and is instead positioned under only a portion of the one or more heaters associated with the temperature sensitive component 8.

The zone definer 1, the optical device 2, and the heat sink 3 can be immobilized relative to one another. For instance, epoxy can be employed to immobilize the optical device 2 relative to the zone definer 1 and epoxy can be employed to immobilize the zone definer 1 relative to the heat sink 3. The thermally conductive medium 21 and/or the cavity medium 14 can be in direct contact with the zone definer. For instance, the thermally conductive medium 21 can be in direct contact with the via medium 12. Additionally or alternately, a thermally conducting adhesive or epoxy can be employed to bond the thermally conductive medium 21 to the via medium 12 and/or a thermally insulating adhesive or epoxy can be employed to bond the thermal insulator with the portion of the base outside of the thermal cavity 19. The via medium 12 can be in direct contact with the heat sink 3. Additionally or alternately, a thermally conducting adhesive or epoxy can be employed to bond the via medium with the heat sink 3 and/or a thermally insulating adhesive or epoxy can be employed to bond the thermal insulator 11 and the heat sink 3.

A suitable thermal conductivity for a thermally conducting adhesive or epoxy includes, but is not limited to, a thermal conductivity above 0.5 W/mK or 1 W/mK. A suitable thermal conductivity for a thermally insulating adhesive or epoxy includes, but is not limited to, a thermal conductivity less than 0.5 W/mK, or 1 mW/mK. An example of a thermally conducting epoxy is Dow Corning® 3-6751 and examples of a thermally insulating epoxies include glass filled epoxies.

Although the system is disclosed as having a thermal via 10 under one or more heat-generating components 7, a thermal via 10 can be positioned under optical components 4 that are not heat-generating components 7. In some instances, none of the optical components 4 over a thermal via 10 are heat-generating components 7. Additionally or alternately, in some instances, none of the optical components 4 over a back cavity 13 are temperature sensitive components 8 and/or none of the optical components 4 over the back cavity 13 are a temperature control device such as a heater.

Figure 3:
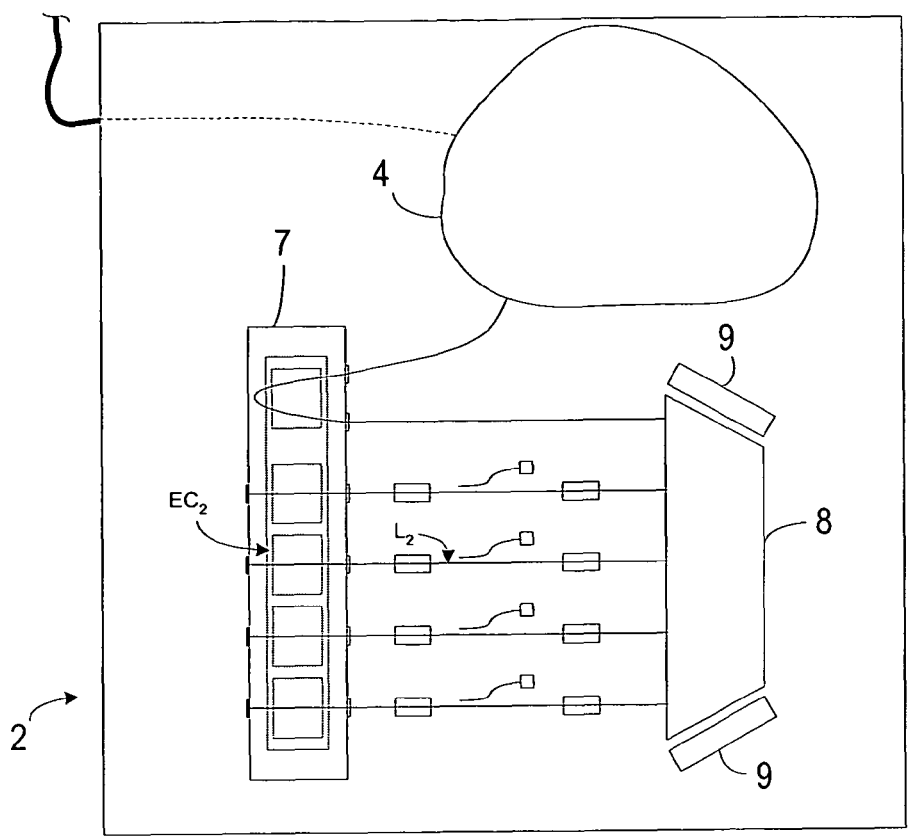
FIG. 3 is a schematic of an optical device that is suitable for use with the systems of FIG. 1A through FIG. 2B.

FIG. 3 is a schematic of an optical device 2 that is suitable for use with a zone definer 1 and heat sink 3 arranged as described above. The device includes a gain medium 15 that provides both laser and amplifier functionality to the optical device 2. The device includes gain waveguides 12 defined in a gain medium 15. Cavity waveguides 16 each provides an optical pathway from the gain waveguides 12 to a partial return device 18. Laser waveguides 20 each provides an optical pathway from one of the partial return devices 18 to a modulator 22. Modulated waveguides 24 each provides an optical pathway from one of the modulators 22 to a combiner 26. A common waveguide 28 provides an optical pathway from the combiner 26 back to the gain medium 15.

An amplifier waveguide 30 provides an optical pathway from the common waveguide 28, through the gain medium 15. An output waveguide 36 provides an optical pathway from the amplifier waveguide 30 to the optical components 4 included on the device.

The optical components 4 are optional. In some instances, the output waveguide 36 does not provide an optical pathway to optical components 4 but instead terminates at a facet. For instance, the output waveguide 36 shown in FIG. 1A can continue to the dashed line shown in FIG. 1A. The output waveguide 36 can then end in a facet located at or near an edge of the device. The device can then be connected to an optical fiber 40 such that the optical fiber 40 receives light guided by the output waveguide 36.

During operation of the device, the cavity waveguides 16 each guides a light signal from the gain medium 15 to the partial return device 18. Each partial return device 18 returns a first portion of the received light signal along its original path and permits a second portion of the light signal to enter the laser waveguide 20. As a result, the second portion of each light signal serves as a laser signal output by a laser cavity.

The cavity waveguides 16 each carries the first portion of the light signal back to one of the gain waveguides 12. The gain waveguides 12 each guides the received first portion of the light signal through the gain medium 15 to a reflector 41. Each reflector 41 reflects the received light signal portion such that the first light signal portion returns to the gain waveguide 12 from which it came. As a result, the reflected light signal portions each eventually return to the partial return device 18 from which it originated. Accordingly, the first light signal portions each travels through a gain waveguide 12 twice before returning to the partial return device 18. Since the partial return device once again returns another portion of the returned first light signal portion, the first portion of the light signal passes through the gain medium 15 multiple times when traveling back and forth between one of the reflectors 41 and the associated partial return device 18. As a result, each reflector 41 and the associated partial return device 18 define one of the laser cavities on the device.

While the first portion of the light signal is making multiple passes through the gain medium 15, energy is applied to the gain medium 15 so as to provide the optical gain needed to cause lasing within the gain medium. In some instance, the energy is electrical energy provided by the electronics but other forms of energy can be used. The reflectors 41 can each be highly reflective so substantially all of the first light signal portions are returned to one of the gain waveguides 12.

The partial return devices 18 can be wavelength dependent in that the partial return devices 18 each returns to the gain medium 15 only particular wavelengths of light while transmitting all other wavelengths. Only the wavelengths returned to the gain medium 15 lase. Accordingly, the selection of wavelengths in each laser signal (the second portion of the light signal that passes the partial return device 18) are in the range of wavelengths returned by the partial return device 18 from which the laser signal exits. Additionally, each of the partial return devices 18 can be configured to return a different range of wavelengths. As a result, each of the different laser signals can include a different range of wavelengths. When the range of wavelengths returned by each of the partial return devices 18 is narrow, each of the different laser signals can be at a different wavelength or can include a different channel. An example of partial return devices 18 that can each return light in a range of wavelengths while transmitting light of other wavelengths are reflective optical gratings such as Bragg gratings.

The laser waveguides 20 each guides one of the laser signals to a modulator 22. Electronics can operate the modulator 22 so as to modulate the laser signals. The modulated waveguides 24 each carries one of the modulated light signals to the combiner 26. The combiner 26 combines the received light signals into an output signal received by the common waveguide 28.

The common waveguide 28 guides the output signal to the amplifier waveguide 30. The amplifier waveguide 30 guides the output signal through the gain medium 15. When the output light signal is being guided through the gain medium 15, energy can be applied to the gain medium 15 to amplify the output signal. In some instance, the energy is electrical energy applied to the gain medium 15 by electronics but other forms of energy can be used.

The amplifier is distinguishable from the laser cavities because the laser cavities rely on multiple passes of photons through the laser cavity. In contrast, the amplifier operates on a single pass of a photon through the amplifier. As discussed above, the multiple photon passes in the laser cavities are the result of the partial return devices 18 and the reflectors 41 being positioned so photons return along their original pathways. This contrasts with the path of a photon through the amplifier. The amplifier waveguide is positioned so the photons travel through the amplifier a single time.

The functionality of the laser cavities and amplifier waveguide can optionally be enhanced by the placement of anti-reflective coatings 42 on the gain medium 15. The anti-reflective coatings 42 can be positioned on surfaces through which light is to be transmitted without reflection or with minimal reflection.

The output waveguide 36 receives the amplified light signal from the amplifier waveguide 30. When the device includes optical components 4, the output waveguide 36 guides the amplified light signal to the optical components 4. When the output waveguide 36 terminates at a facet, the output waveguide 36 guides the amplified light signal to the facet. Accordingly, when an optical fiber 40 is aligned with the facet, the optical fiber 40 receives the amplified light signal from the output waveguide 36.

FIG. 3 includes dashed lines showing the location of multiple first electrical conductors 44 and a common electrical contact 46. The first electrical conductors 44 and the common electrical contacts 46 are each in electrical communication with the gain medium 15 and can each be in direct physical contact with the gain medium 15. Additionally, the gain medium 15 can be between first electrical conductors 44 and the common electrical contact 46. The electronics can be in electrical communication with the first electrical conductors 44 and the common electrical contact 46 and can be configured to use these electrical contacts to apply electrical energy to the gain medium 15.

Four lasers are shown in FIG. 3 although the device can include more or less than four lasers. As is evident from FIG. 3, each of the first electrical conductors 44 is associated with one of the lasers. As a result, the electronics can apply electrical energy to the gain medium 15 associated with a particular one of the lasers and accordingly increase or decrease the intensity of the laser signal produced by that laser. For instance, the electronics can increase the electrical energy applied between the common electrical contact 46 and the first electrical conductor 44 labeled $EC_2$ in FIG. 3 in order to increase the intensity of the laser signal labeled $L_2$ in FIG. 3.

FIG. 3 includes dashed lines showing the location of an amplifier electrical contact 47. The amplifier electrical contact 47 can be in electrical communication with the gain medium 15 and in direct physical contact with the gain medium 15. Additionally, the gain medium 15 can be between amplifier electrical contact 47 and the common electrical contact 46. The electronics can be in electrical communication with the amplifier electrical contacts 47 and the common electrical contact 46 and can be configured to use these electrical contacts to apply electrical energy to the gain medium 15. The electronics can be configured to apply the electrical energy to the gain medium 15 such that the output light signal is amplified upon traveling through the amplifier waveguide 30. Accordingly, the electronics can adjust the level of amplification of the amplified light signal by increasing or decreasing the intensity of electrical energy applied through the amplifier electrical contact 47.

Figure 4A:
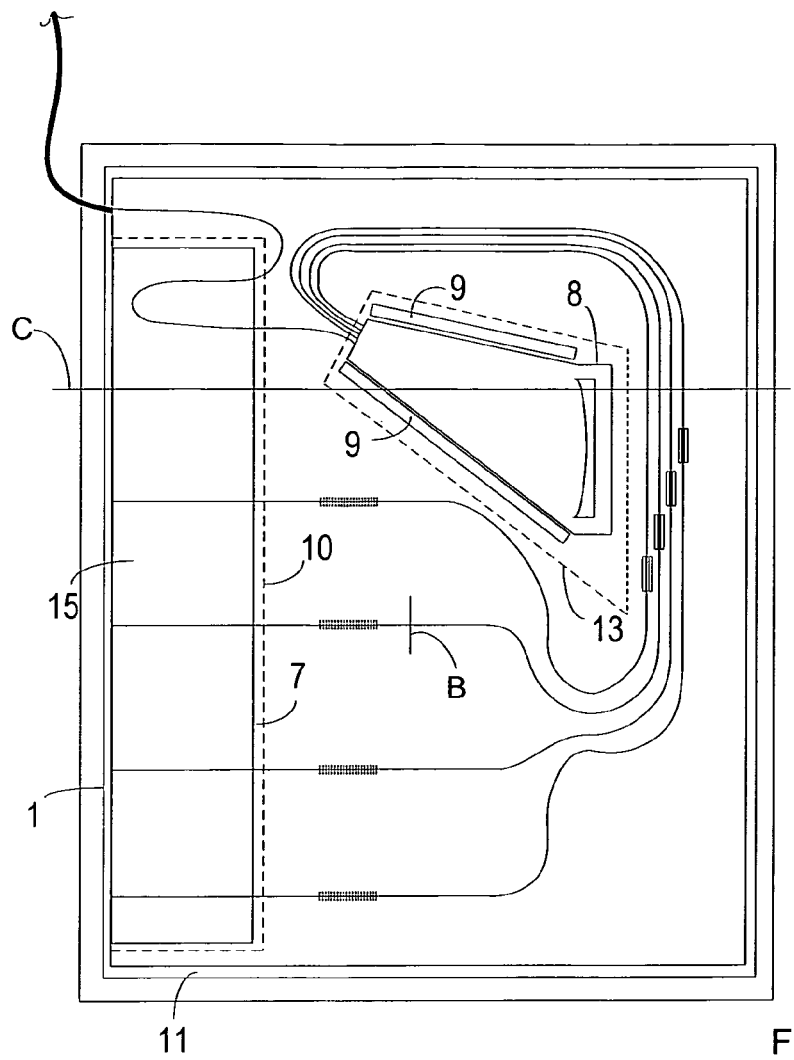
FIG. 4A through FIG. 4C illustrate a system according to FIG. 2A and FIG. 2B using a device constructed on a silicon-on-insulator wafer.
Figure 4B:
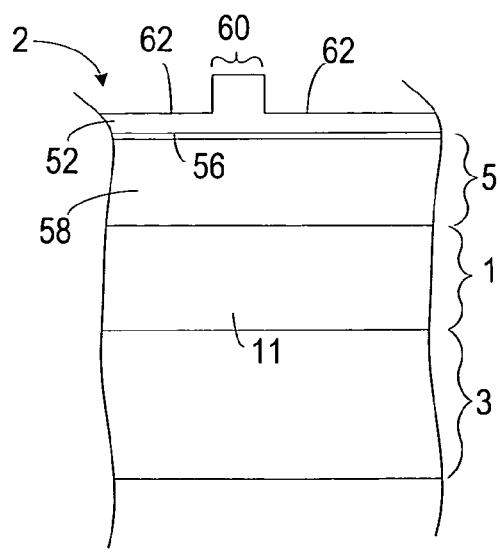
Figure 4C:
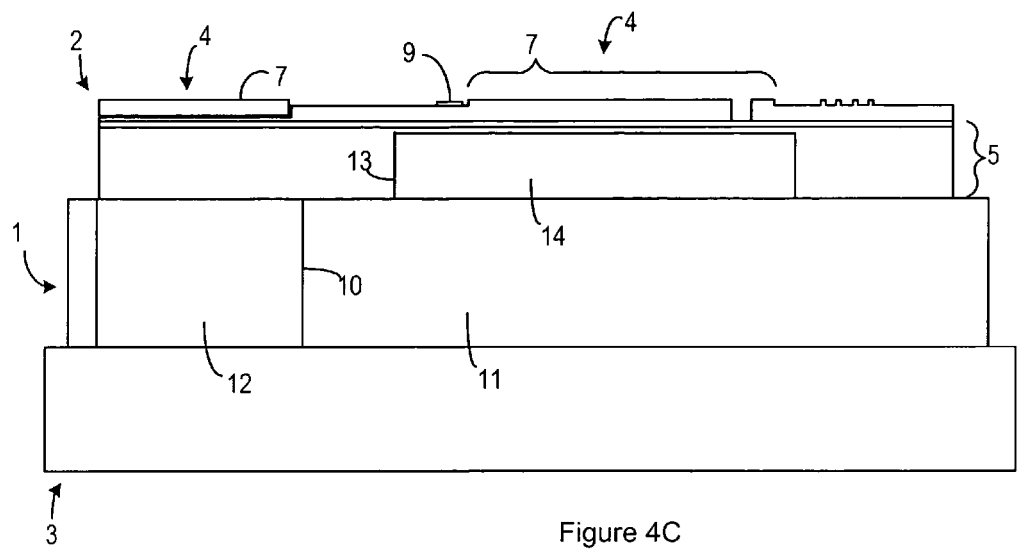

FIG. 4A is a topview of a system that includes a device constructed according to the schematic shown in FIG. 3. FIG. 4B is a cross section of the system shown in FIG. 4A taken along the line labeled B in FIG. 4A. FIG. 4C is a cross section of the system shown in FIG. 4A taken along the line labeled C in FIG. 4A. The device employs a Bragg gratings as the partial return device 18 and an echelle grating as the combiner 26. The output waveguide 36 guides the amplified light signal to an optical fiber 40.

FIG. 4B shows a cross section of a waveguide on the device. For instance, FIG. 4B can be a cross-section of the cavity waveguides 16, the laser waveguides 20, modulated waveguides 24, common waveguide 28, and/or output waveguides 36. In one example, each of the cavity waveguides 16, the laser waveguides 20, modulated waveguides 24, common waveguide 28, and/or output waveguides 36 is constructed according to FIG. 4B. The device includes a light-transmitting medium 52 on a base 5 that includes an optical insulator 56 positioned on a substrate 58. Suitable light-transmitting media include, but are not limited to, silicon, polymers, silica, SIN, GaAs, InP and $LiNbO_3$.

The waveguide is partially defined by a ridge 60 of the light-transmitting medium 52 extending outward from slab regions 62 of the light-transmitting medium 52. The ridge 60 and the base 5 together define a portion of the light signal-carrying region where light signals are constrained within the waveguide. For instance, the ridge 60 of light-transmitting medium 52 can optionally include a cladding (not shown) with an index of refraction that is less than the index of refraction of the light-transmitting medium 52. Likewise, the optical insulator 56 can have an index of refraction that is less than an index of refraction of the light-transmitting medium 52. The drops in index of refraction causes light signals being carried within the light signal-carrying region to be reflected back into the light signal-carrying region. Accordingly, the light signal is constrained between the ridge 60 and the optical insulator 56. Suitable claddings include, but are not limited to, silicon nitride (SiN) and silica ($SiO_2$) and can include one layer or more than one layer of material.

A suitable platform having a structure according to FIG. 4B is a silicon-on-insulator wafer although other platforms can be used. A silicon-on-insulator wafer includes a silicon layer positioned on a base 5. The silicon layer serves as the light-transmitting medium 52 through which light signals are guided. The base 5 includes a layer silica positioned on a silicon substrate. The layer of silica can serve as the optical insulator 56 and the silicon substrate can serve as the substrate 58.

During operation of the laser cavities shown in FIG. 4A, heat is generated as a result of the application of electrical energy to the gain media. Accordingly, the gain medium serves as a heat-generating component 7 on the device. As a result, the zone definer 1 includes a thermal via 10 for conducting the heat from the gain medium into the heat sink 3. The location of the thermal via 10 medium is shown by the dashed lines in FIG. 4A. As is evident from these dashed lines, the thermal via 10 is located under the heat-generating component 7.

The echelle grating is a temperature sensitive component 8. For instances, the echelle grating is configured to operate in a particular range of temperatures that are above room temperature. Movement of the temperature outside of this range causes the wavelengths received on the common waveguide 28 to shift and can accordingly adversely affect the performance of the echelle grating. As a result, the device includes heaters 9 on opposing sides of the echelle grating where the emitted heat is conducted to the echelle grating. Although FIG. 4A through FIG. 4C show the heaters 9 positioned on top of the device, the device of FIG. 4A through FIG. 4C can additionally or alternately include one or more cavity heaters 17 located in the back cavity 13 as discussed in the context of FIG. 2A through FIG. 2B. It is often desirable for electronics to use the heaters 9 and/or one or more cavity heaters 17 in combination with output from one or more temperature sensors to keep the echelle grating in the desired temperature range. As discussed above, the back cavity 13 makes this temperature control more efficient. The location of the back cavity 13 is shown by the dashed lines in FIG. 4A. As is evident from these dashed lines, the back cavity 13 defines a heat retention zone around the echelle grating and the associated heaters 9 and/or or cavity heater 17.

FIG. 4C shows the back cavity 13 extending toward the optical insulator 56 but leaves a portion of the substrate between the cavity medium 14 and the optical insulator 56. In some instances, the back cavity 13 extends to the level of the optical insulator 56. The thickness of the portion of the substrate between the back cavity 13 and the optical insulator can be less than 200, 100, or 10 microns.

In some instances, the heat sink 3 has a thermal conductivity that is at least more than two times, or more than five times, or more than ten times the thermal conductivity of the thermal insulator 11. Additionally or alternately, the via medium 12 has a thermal conductivity that is at least more than two times, or more than five times, or more than ten times the thermal conductivity of the thermal insulator 11. Additionally or alternately, the portion of the base 5 contacting the thermal insulator 11 has a thermal conductivity that is at least more than two times, or more than five times, or more than ten times the thermal conductivity of the thermal insulator 11. Additionally or alternately, when the optical device 2 has a back cavity 13, in some instances, the cavity medium 14 has a thermal conductivity that is at most $10^{-3}$ times, $10^{-2}$ times, or $10^{-1}$ times or 0.7 times the thermal conductivity of each or a portion of the base 5 materials through which the back cavity 13 extends. Additionally or alternately, when the optical device 2 has a thermal cavity 19, the thermally conductive medium 21 has a thermal conductivity that at least more than two times, or more than five times, or more than ten times the thermal conductivity of all or a portion of the materials in the base that define the thermal cavity 19.

A suitable thermal conductivity for the heat sink 3 includes, but is not limited to, a thermal conductivity above 500 $Wm^{-1}K^{-1}$, 400 $Wm^{-1}K^{-1}$, or 300 $Wm^{-1}K^{-1}$. A suitable thermal conductivity for the thermal insulator 11 includes, but is not limited to, a thermal conductivity below 0.1, 0.5, or 1 $Wm^{-1}K^{-1}$. A suitable thermal conductivity for the via medium 12 includes, but is not limited to, a thermal conductivity above 400 $Wm^{-1}K^{-1}$, or 200 $Wm^{-1}K^{-1}$. A suitable thermal conductivity for the cavity medium 14 includes, but is not limited to, a thermal conductivity below 0.001 $Wm^{-1}K^{-1}$, 0.01 $Wm^{-1}K^{-1}$, or 0.1 $Wm^{-1}K^{-1}$. A suitable thermal conductivity for the thermally conductive medium 21 includes, but is not limited to, a thermal conductivity greater than 200 w/mK. A suitable thermal conductivity for all or a portion of the material through which the thermal cavity 19 extends includes, but is not limited to, a thermal conductivity above 0.001 $Wm^{-1}K^{-1}$, 0.01 $Wm^{-1}K^{-1}$, or 0.1 $Wm^{-1}K^{-1}$. A suitable thermal conductivity for the portion of the base 5 contacting the zone definer 1 includes, but is not limited to, a thermal conductivity above 400 $Wm^{-1}K^{-1}$, 300 $Wm^{-1}K^{-1}$, or 200 $Wm^{-1}K^{-1}$.

Suitable materials for the heat sink 3 include, but are not limited to, copper, aluminum, and synthetic diamond. A suitable thickness for the heat sink 3 includes, but is not limited to, a thickness greater than 2 mm, 5 mm, or 10 mm. In some instances, the heat sink 3 is wider and/or longer than the optical device 2 and/or the zone definer 1. Suitable materials for the thermal insulator 11 include, but are not limited to, borosilicate glass, ceramics, and polymers. Suitable materials for the via medium 12 include, but are not limited to, copper, aluminum, synthetic diamond, gold, silver, and combinations thereof. Suitable materials for the cavity medium 14 include, but are not limited to, a gas such as air, a solid such as glass or a doped light-transmitting medium such as doped silicon, and vacuum. Suitable materials for the portion of the base 5 contacting the zone definer 1 includes, but are not limited to, silicon. Suitable materials for the cavity medium 14 include, but are not limited to, a gas such as air, a solid such as glass or a doped light-transmitting medium such as doped silicon, and vacuum. Suitable materials for the thermally conductive medium 21 include, but are not limited to, copper, gold or silver.

A back cavity 13 and/or thermal cavity 19 can be formed in an optical device 2 by techniques such as etching, dicing, or laser ablation. When the substrate is a silicon substrate, a suitable etch for forming the back cavity 13 and/or thermal cavity 19 includes, but is not limited to, dry etching, TMAH (tetramethylammonium hydroxide), or KOH. In one example, the base 5 includes or consist or silicon and/or the substrate 58 includes or consists of silicon and the cavity medium is doped silicon. In this instance, the back cavity 13 can be formed by doping the portion of the base 5 and/or substrate 58 that will serve as the back cavity.

Figure 5A:
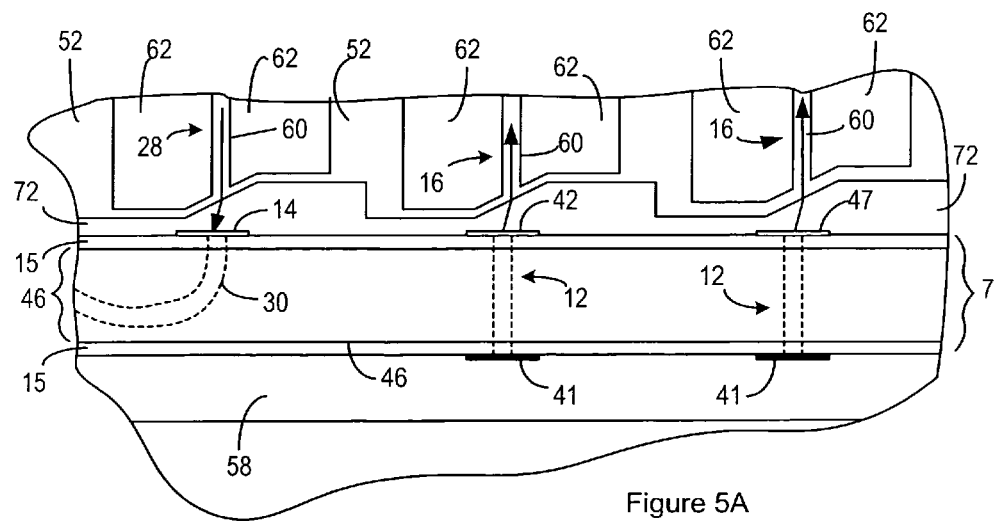
FIG. 5A through FIG. 5B illustrate placement of a laser bar on an optical device.

Because FIG. 3 and FIG. 4 do not provide any of the details regarding the relationship between the gain medium and the remainder of the optical device, FIG. 5A through FIG. 7B illustrate a suitable interface between a gain medium ad the remainder of the optical device 2. The interface of FIG. 5A through FIG. 7B is suitable for use with the optical devices of FIG. 3 and FIG. 4. FIG. 5A through FIG. 5B illustrate a laser bar that includes a gain medium 15 incorporated into an optical device 2 according to FIG. 3 or FIG. 4. FIG. 5A is a topview of the optical device 2.

The portion of the device illustrated in FIG. 5A includes the common waveguide 28. A first amplifier waveguide 30 on the laser bar receives an output light signal from the common waveguide 28. Since a ridge 76 for the first amplifier waveguide 30 is on a bottom side of the laser bar and FIG. 5A is a topview, the location of the ridge 76 for the first amplifier waveguide 30 is shown by dashed lines. The output light signal exits the common waveguide 28 through a facet. The facet can be angled at less than 90° relative to the direction of propagation through the common waveguide 28 at the facet. The angle can reduce performance reductions associated with back reflection.

The output light signal is transmitted through a facet of the first amplifier waveguide 30 upon entering the first amplifier waveguide 30, is amplified, and is then transmitted through a second facet of the first amplifier waveguide 30 as an amplified light signal. As a result, an anti-reflective coating 42 is located on both facets of the first amplifier waveguide 30. Suitable anti-reflective coatings 42 include, but are not limited to, single-layer coatings such as silicon nitride or aluminum oxide, or multilayer coatings which may contain silicon nitride, aluminum oxide, and/or silica.

The portion of the device illustrated in FIG. 5A also includes cavity waveguides 16 that each receives the first portion of a light signal from a different gain waveguide 12 on the laser bar. Since a ridge 76 for each of the gain waveguides 12 is on a bottom side of the laser bar and FIG. 5A is a topview, the locations of the ridges 76 for the gain waveguides 12 are each shown by dashed lines. The light signals each enter the cavity waveguides 16 through a facet. The facet can be angled at less than 90° relative to the direction of propagation through the cavity waveguide 16 at the facet. The angle can reduce performance reduction associated with back reflection.

The side of the gain medium 15 at which the first portion of the light signal is reflected includes a material that serves as the reflector 41. A suitable material for forming the reflector 41 includes, but is not limited to, a layer of metal on the layer of gain medium 15. The side of the gain medium 15 through which the first portion of the light signal is transmitted includes an anti-reflective coating 42. A material that serves as a suitable anti-reflective coatings 42 includes, but is not limited to, single-layer coatings such as silicon nitride or aluminum oxide, or multilayer coatings which may contain silicon nitride, aluminum oxide, and/or silica.

Figure 5B:
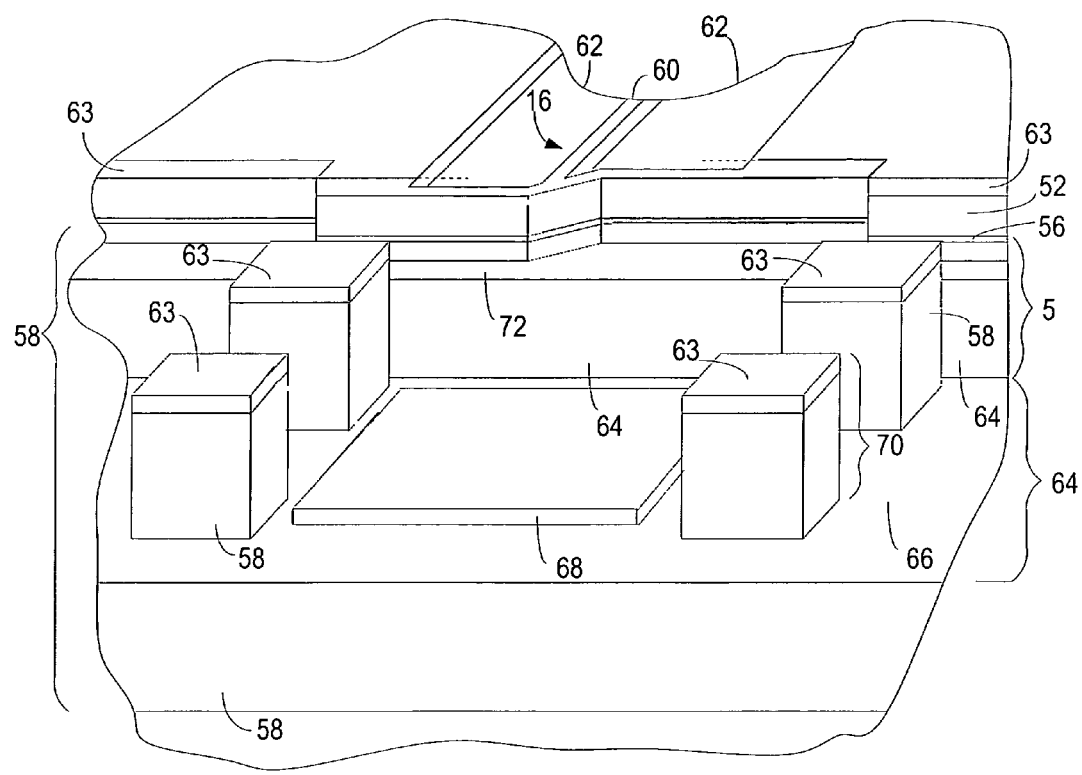

FIG. 5B is a perspective view of a portion of the optical device 2 shown in FIG. 5A. The illustrated portion of the optical device 2 is suitable for interfacing with one of the lasers on the laser bar or with the amplifier on the laser bar. The laser bar is not illustrated in FIG. 5B in order to make the portion of the optical device 2 under the laser bar visible. A cladding 63 is shown on the light-transmitting medium 52. While the cladding 63 is present over the waveguides and in the trenches, the cladding 63 is not shown in these locations in order to make certain features of the optical device 2 readily visible.

A recess 64 extends into the base 5 to form a laser bar platform 66. Contact pads 68 positioned on the laser bar platform 66 can be employed for providing electrical communication with a laser on the laser bar or with the amplifier on the laser bar. One or more stops 70 extend upward from the laser bar platform 66. For instance, FIG. 5B illustrates four stops 70 extending upward from the laser bar platform 66. The stops 70 include the cladding 63 positioned on a base portion. The substrate 58 can serve as the base portion of the stops 70 and the stop 70 can exclude the light insulator 56 or be made of the same material as the light insulator 56. The portion of the substrate 58 included in the stops 70 can extend from the platform up to the level of the light insulator 56. For instance, the stops 70 can be formed by etching through the light insulator 56 and using the underlying substrate 58 as an etch-stop. The cladding 63 can then be formed on the first light-transmitting medium 52 at the same time the cladding 63 is formed on the base portion of the stops 70.

A secondary platform 72 can optionally be positioned between the facet of the waveguides and the laser bar platform 66. The secondary platform 72 is elevated relative to the laser bar platform 66. For instance, the secondary platform 72 can be above the laser bar platform 66 and at or below the level of the light insulator 56. The secondary platform 72 can essentially be the top of the substrate 58 or the secondary platform 72 can be positioned below the level of the light insulator 56 as illustrated in FIG. 5B. Alternately, the secondary platform 72 can be etched concurrently with the base portion of the stops 70 resulting in the secondary platform 72 and the base portion of the stops 70 having about the same height above the laser bar platform 66. Alternately, the secondary platform 72 may not be present at all. For instance, the portion of the base 5 between the laser bar platform 66 and the waveguide facet can be substantially vertical relative to the laser bar platform 66.

The optical device 2 includes one or more alignment marks (not shown). Suitable marks include recesses that extend into the optical device 2. An alignment recess can extend into the first light-transmitting medium 52 and/or the base 5. In some instances, one or more of the alignment recesses extend into the secondary platform 72. During attachment of the laser bar to the optical device 2, the alignment recesses can be aligned with secondary alignment recesses (not shown) on the laser bar in order to achieve horizontal alignment of the laser bar relative to the optical device 2.

FIG. 6A through FIG. 6D illustrate a laser bar that is suitable for use with an optical device 2 constructed according to FIG. 5A through FIG. 5B. FIG. 6A is a bottom view of the laser bar. FIG. 6B is a cross-section of the laser bar shown in FIG. 6A taken along the line labeled B in FIG. 6A. FIG. 6C is a cross-section of the laser bar shown in FIG. 6A taken along the line labeled C in FIG. 6A. FIG. 6D is a topview of the laser bar. The laser bar includes waveguides defined in the gain medium 15 for multiple lasers and an amplifier. Trenches 74 extending into the gain medium 15 define ridges 76 in the gain medium 15. The ridges 76 each defines a first amplifier waveguide 30 or one of the gain waveguides 12. Suitable gain media include, but are not limited to, InP, InGaAsP, and GaAs.

A laser bar cladding 78 is positioned on the gain medium 15. A first electrical conductor 44 positioned on the cladding 78 includes a contact region 80 that extends through an opening in the laser cladding 78 into contact with a top of the ridge 76. The first electrical conductor 44 extends from the contact region 80 across a trench 74 to a contact pad 82. The contact pad 82 can be employed to apply electrical energy to the laser. One of the illustrated first electrical conductors 44 can also serve as the amplifier electrical contact 47.

One or more alignment trenches 90 are positioned between adjacent ridges 76. For instance, FIG. 6A illustrates two alignment trenches 90 between adjacent ridges 76 and positioned on opposing sides of the laser bar. A secondary stop 92 extends upward from the bottom of the alignment trench.

Although FIG. 6A through FIG. 6D illustrate a secondary stop 92 extending upward from a bottom of the alignment trench such that walls of the secondary stop are spaced apart from walls of the alignment trench, the bottom of the alignment trench can be substantially flat. However, an embodiment having walls of the secondary stop spaced apart from walls of the alignment trench may be preferred to reduce etch induced inconsistencies on the tops of the secondary stops.

The common electrical contact 46 is positioned under the gain medium 15. The common electrical contact 46 can be used as a ground for each of the lasers when applying electrical energy to a laser and also for the amplifier when applying electrical energy to the amplifier.

Figure 7A:
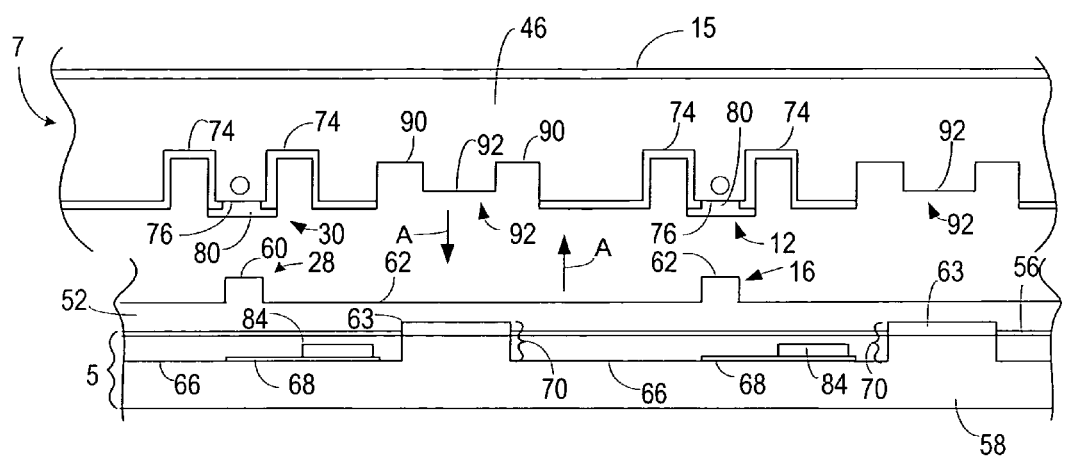
FIG. 7A illustrates assembly of an optical device constructed according to FIG. 5A through FIG. 5B and a laser bar constructed according to FIG. 6A through FIG. 6D.

FIG. 7A illustrates assembly of the optical system using an optical device 2 constructed according to FIG. 5A through FIG. 5B and a laser bar constructed according to FIG. 6A through FIG. 6D. The optical device 2 illustrated in FIG. 7A does not show either a cross-sectional view or a sideview. Instead, the view of the optical device 2 shows the relative positions of different features of the optical device 2 when looking at a sideview of the optical device 2. In contrast, the laser bar illustrated in FIG. 7A is a cross-sectional view of the laser bar such as the cross section of FIG. 6C.

The device can be assembled by moving the optical device 2 and the laser bar toward one another as indicated by the arrows labeled A. Each of the stops 70 on the optical device 2 is aligned with one of the secondary stops on the laser bar.

FIG. 7A shows solder pads 84 positioned on the contact pads 68 on the laser bar platforms 66. The solder pads 84 can be used to immobilize the laser bar relative to the optical device 2 once the laser bar is positioned on the optical device 2. The solder pads 84 can also provide electrical communication between the contact pads 68 on the laser platform and the contact pads 82 on the laser bar. Accordingly, the electronics are in electrical communication with the common electrical contact 46 and each of the contact pads 68 on the laser platform. The electronics can apply electrical energy to each of the lasers and/or the amplifier by applying electrical energy across the associated contact pad 68 and the common electrical contact 46.

Figure 7B:
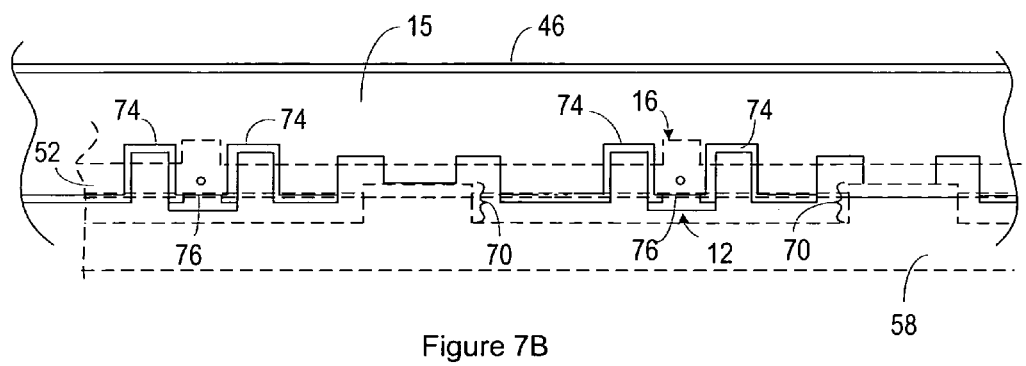
FIG. 7B illustrates the optical device as shown in FIG. 7A and the laser bar as shown in FIG. 7A assembled to form an optical device according to FIG. 5A.

FIG. 7B illustrates the optical device 2 as shown in FIG. 7A and the laser bar as shown in FIG. 7A assembled in an optical assembly according to FIG. 5A. For the purposes of clarity, the optical device 2 is shown by the dashed lines while the laser bar is shown by solid lines. The solder pads 84 are also removed from this illustration. Each of the stops 70 on the optical device 2 meets one of the secondary stops on the laser bar. As a result, the vertical movement of the optical device 2 and the laser bar toward one another is limited by the stops 70 butting against the secondary stops.

In FIG. 7A, circles show the mode of the first light signal portion in the gain waveguides 12 and also in the mode of the amplified light signal in the first amplifier waveguide 30. As is evident from FIG. 7B, the modes are each aligned with the facets of a cavity waveguide 16 or the output waveguide 36.

Additional details regarding the fabrication, structure, and/or alignment of a laser bar with an optical device 2 as shown in FIG. 5A through FIG. 7B can be found in U.S. patent application Ser. No. 12/215,693, filed on Jun. 28, 2008, granted U.S. Pat. No. 7,658,552, entitled "Interface Between Light Source and Optical Component," and incorporated herein in its entirety.

Suitable partial return devices 18 include, but are not limited to, a reflective optical grating such as a Bragg grating.

The modulators 22 are preferably each an intensity modulator 22 but can be other modulators 22 such as phase modulators 22. A variety of different modulator 22 constructions are suitable for use with waveguides on a silicon-on-insulator platform. In some instances, the modulators 22 are constructed and operated as shown in U.S. patent application Ser. No. 11/146,898; filed on Jun. 7, 2005; entitled "High Speed Optical Phase Modulator," and now U.S. Pat. No. 7,394,948; or as disclosed in U.S. patent application Ser. No. 11/147,403; filed on Jun. 7, 2005; entitled "High Speed Optical Intensity Modulator," and now U.S. Pat. No. 7,394,949; or as disclosed in U.S. patent application Ser. No. 12/154,435; filed on May 21, 2008; entitled "High Speed Optical Phase Modulator," and now U.S. Pat. No. 7,652,630; or as disclosed in U.S. patent application Ser. No. 12/319,718; filed on Jan. 8, 2009; and entitled "High Speed Optical Modulator;" or as disclosed in U.S. patent application Ser. No. 12/928,076; filed on Dec. 1, 2010; and entitled "Ring Resonator with Wavelength Selectivity;" or as disclosed in U.S. patent application Ser. No. 12/228,671, filed on Aug. 13, 2008, and entitled "Electrooptic Silicon Modulator with Enhanced Bandwidth;" or as disclosed in U.S. patent application Ser. No. 12/653,547, filed on Dec. 15, 2009, and entitled "Optical device 2 Having Modulator Employing Horizontal Electrical Field;" or as disclosed in U.S. patent application Ser. No. 12/660,149, filed on Feb. 19, 2010, and entitled "Reducing Optical Loss in Optical Modulator Using Depletion Region;" each of which is incorporated herein in its entirety.

In some instances, modulators 22 that generate photocurrent in response to the modulation of light signals are preferred modulators 22 because they can also be used as a light sensor and each of these modulators 22 can accordingly replace one of the coupled waveguides 48 and light sensors. Examples of these modulators 22 are modulators 22 that make use of the Franz Keldysh effect. An example of such as modulator 22 is disclosed in U.S. patent application Ser. No. 12/653,547.

Suitable combiners 26 for use with the device can be either wavelength dependent multiplexers such as echelle gratings or arrayed waveguide gratings. In some instances, the combiner 26 can be a wavelength independent combiner such as combiners that employ waveguides that intersect one another so as to combine light signals from different waveguides. Suitable echelle grating structures and/or methods of fabricating echelle gratings on a silicon-on-insulator wafer are disclosed in U.S. patent application Ser. No. 12/800,600, filed on May 18, 2010, and entitled "Extension of Steps in Reflective Optical Gratings;" and also in U.S. Provisional Patent Application Ser. No. 61/284,723, filed on Dec. 23, 2009, and entitled "Reducing Optical Loss in Reflective Optical Gratings;" and also in U.S. patent application Ser. No. 12/927,412, filed on Nov. 12, 2010, and entitled "Reducing Optical Loss in Reflective Optical Gratings;" and also in U.S. patent application Ser. No. 12/321,386, filed on Jan. 16, 2009, and entitled "Optical Component Having Features Extending Different Depths into a Light Transmitting Medium," each of which is incorporated herein in its entirety. The echelle grating structures and/or methods of echelle grating fabrication disclosed in these patent applications can be employed in the combiner 26 of a device constructed according to FIG. 3 through FIG. 4C. An example of a suitable wavelength independent combiner that employ one or more y-junctions is disclosed in U.S. patent application Ser. No. 10/644,395, filed on Aug. 19, 2003, and entitled "Multiplexer Having Improved Efficiency," and now U.S. Pat. No. 7,805,037; and also in U.S. Provisional Patent Application Ser. No. 10/600,748, filed on Jun. 20, 2003, and entitled "Multiplexer Having Improved Efficiency," each of which is incorporated herein in its entirety. The y-junction structures and/or methods of fabrication disclosed in these patent applications can modified to employ single mode waveguides or multimode waveguides and can be employed in the combiner 26 of a device constructed according to FIG. 3 through FIG. 4C.

In some instances, wavelength dependent multiplexers can become more desirable than wavelength independent combiners as the number of light signals that are combined by the combiner 26 increases. The optical loss associated with combiners increases as the numbers of light signals that must be combined increases. In some instances, the amount of optical loss is stronger in wavelength independent combiners than in wavelength dependent multiplexers. Accordingly, the use of wavelength dependent multiplexers may become more desirable as the number of light signals combined by the combiner 26 increases.

Additional details regarding suitable construction, fabrication, and operation of optical devices 2 according to FIG. 3 through FIG. 7B can be found in U.S. Utility patent application Ser. No. 13/317,340 filed on Oct. 14, 2011, entitled "Gain Medium Providing Laser and Amplifier Functionality to Optical Device" and incorporated herein in its entirety.

Suitable electronics for operating the above monitors can include a controller. A suitable controller includes, but is not limited to, a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions attributed to the electronics. A general-purpose processor may be a microprocessor, but in the alternative, the controller may include or consist of any conventional processor, microcontroller, or state machine. A controller may also be implemented as a combination of computing devices, e.g., a combination of a DSP and a microprocessor, a plurality of microprocessors, one or more microprocessors in conjunction with a DSP core, or any other such configuration.

The electronics can optionally include a memory in communication with the controller. The electronics can store data for executing the functions of the electronics in the memory. The memory can be any memory device or combination of memory devices suitable for read and/or write operations.

In some instances, the electronics include a computer-readable medium in communication with the controller. The computer-readable medium can have a set of instructions to be executed by the controller. The controller can read and execute instructions included on the computer-readable medium. The controller executes the instructions such that the electronics perform one or more of the described functions. The computer-readable medium cab be different from the memory or can be the same as the memory. Suitable computer-readable media include, but are not limited to, optical discs such as CDs, magnetic storage diskettes, Zip disks, flash memories, magnetic tapes, RAMs, and ROMs. Some functions of the electronics may be executed using hardware as opposed to executing these functions in firmware and/or software.

Although the device is described in the context of each laser cavity producing a laser signal having different wavelengths, the device can be constructed such that two or more of the laser cavities generate laser signals having the same range of wavelengths. The gain waveguides and/or cavity waveguides of laser cavities configured to generate lasers signals having the same wavelength can be optically coupled as a result of their proximity on the device. Optical coupling of these one or more of these waveguides can increase the power of the laser signals as described in U.S. Patent Application Ser. No. 61/463,054, filed on Feb. 10, 2011, entitled "Laser Combining Light Signals from Multiple Laser Cavities," and incorporated herein in its entirety. The gain waveguides and/or cavity waveguides of laser cavities configured to generate lasers signals of different wavelengths are optically decoupled.

Although the device is described as having multiple laser cavities, the device can include a single laser cavity and an amplifier that share the same gain medium. In this instance, there may not be multiple modulated light signals present for a combiner to combine. As a result, the device need not include a combiner and the combiner is optional.

Although the system is disclosed as having a zone definer with one or more thermal vias in combination with an optical device having one or more back cavities, in some instances, the system includes a zone definer with one or more thermal vias in combination with an optical device that excludes back cavities. Alternately, in some instances, the system includes an optical device that excludes back cavities in combination with a zone definer having one or more thermal vias.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A system, comprising:
an optical device constructed on a silicon-on-insulator wafer that includes a base, the device having optical components on the base and one or more waveguides on the base;
a heat sink; and
a zone definer contacting the base and the heat sink such that the zone definer conducts thermal energy from the optical device to the heat sink,
the zone definer including a thermal insulator having a lower thermal conductivity than both the heat sink and the base,
the zone definer including a thermal via extending through the thermal insulator and being located under one of the optical components such that a line that is perpendicular to an upper surface of the heat sink can extend through the thermal via and the optical component under which the thermal via is positioned,
a via medium being positioned in the thermal via and having a higher thermal conductivity than the thermal insulator.

2. The system of claim 1, wherein one of the components is a heat-generating component that generates thermal energy that is injected into the base during operation of the heat-generating component, and
the component under which the thermal via is located is the heat-generating component.

3. The system of claim 2, wherein the thermal insulator is positioned under a portion of the components that does not include the component under which the thermal via is located, the thermal insulator being under the portion of the components such that for each component included in the portion of components a second line that is perpendicular to an upper surface of the thermal insulator can extend through the thermal insulator and also through the component included in the portion of components.

4. The system of claim 2, wherein the thermal via is one of a plurality of thermal vias included in the zone definer,
the thermal vias each extending through the thermal insulator and being located under one of the optical components,
a via medium being positioned in each of the thermal vias and having a higher thermal conductivity than the thermal insulator,
more than one of the components is a heat-generating component, and one or more of the thermal vias is under one or more of the heat generating components.

5. The system of claim 1, wherein the optical device includes a back cavity that extends from a bottom side of the base up into the base where a top side of the base is between the bottom side of the base and the components,
the back cavity being located under one or more of the optical components,
a medium inside the back cavity having a thermal conductivity that is less than the thermal conductivity of the base,
the back cavity being located under the one or more of the optical components such that for each of the one or more optical components under which the back cavity is located a third line that is perpendicular to a surface of the base can extend through the back cavity and through the component included in the one or more optical components under which the back cavity is located.

6. The system of claim 5, wherein at least one of the one or more components under which the back cavity is located is a temperature sensitive component in that the performance of the temperature sensitive component changes in response to a change in the temperature of the temperature sensitive component.

7. The system of claim 6, wherein the optical device includes one or more heaters positioned so as to heat the temperature sensitive component and the back cavity is positioned under the one or more heaters,
the back cavity being located under the one or more heaters such that for each of the one or more heaters a fourth line that is perpendicular to a surface of the base can extend through the back cavity and through the heater included in the one or more heaters.

8. The system of claim 7, further comprising:
electronics configured to maintain a temperature of the temperature sensitive component in a range of temperatures.

9. The system of claim 7, wherein the temperature sensitive component includes one or more components selected from a group consisting of an attenuator, a modulator, and a combiner.

10. The system of claim 9, wherein the temperature sensitive component includes an echelle grating.

11. The system of claim 5, wherein the medium inside the back cavity is air.

12. The system of claim 1, wherein a projection of the thermal via onto the optical component under which the thermal via is positioned has the thermal via surrounding the optical component under which the thermal via is positioned.

13. A system, comprising:
an optical device that includes optical components on a base, the device also including a layer of silicon positioned on the base, the base including a first insulator on a silicon substrate such that the first insulator is between the layer of silicon and the silicon substrate,
waveguides defined in the silicon layer by ridges of the silicon layer extending upward from slabs of the silicon silicon layer such that the slabs are between the ridges and the base,
a heat sink; and a zone definer between the base and the heat sink such that the zone definer conducts thermal energy from the optical device to the heat sink,
    the zone definer including a thermal insulator having a lower thermal conductivity than both the heat sink and the base,
    the zone definer including a thermal via extending through the thermal insulator and being located under one of the optical components such that a line that is perpendicular to an upper surface of the heat sink can extend through the thermal via and the optical component under which the thermal via is positioned,
    a via medium being positioned in the thermal via and having a higher thermal conductivity than the thermal insulator.

14. The system of claim 13, wherein the thermal insulator is positioned under a portion of the components that does not include the component under which the thermal via is located, the thermal insulator being under the portion of the components such that for each component included in the portion of components a second line that is perpendicular to an upper surface of the thermal insulator can extend through the thermal insulator and also through the component included in the portion of components.

15. The system of claim 13, wherein the waveguides guide light signals between at least a portion of the optical components.

16. The system of claim 13, wherein one of the components is a heat-generating component that generates thermal energy that is injected into the base during operation of the heat-generating component;
    the component under which the thermal via is located is the heat-generating component;
    the optical device includes a back cavity that extends from a bottom side of the base up into the base where a top side of the base is between the bottom side of the base and the components, the back cavity being located under one or more of the optical components;
    the one or more optical components under which the back cavity is positioned do not include the component under which the thermal via is positioned; and
    the back cavity is located under the one or more of the optical components such that for each of the one or more optical components a third line that is perpendicular to a surface of the base can extend through the back cavity and through the component included in the one or more optical components.

17. The system of claim 16, wherein the medium inside the back cavity is air.

18. The system of claim 16, wherein at least one of the one or more components under which the back cavity is located is a temperature sensitive component in that the performance of the temperature sensitive component changes in response to a change in the temperature of the temperature sensitive component.

19. The system of claim 18, wherein the thermal insulator is positioned under the temperature sensitive component such that a line that is perpendicular to a surface of the base can extend through the thermal insulator and the temperature sensitive component.

20. The system of claim 13, wherein a projection of the thermal via onto the optical component under which the thermal via is positioned has the thermal via surrounding the optical component under which the thermal via is positioned.

21. The system of claim 13, wherein the zone definer contacts the base and the heat sink.

22. The system of claim 13, wherein the optical component under which the thermal via is positioned is one of a plurality of optical components under which the thermal via is positioned.

23. The system of claim 13, wherein the zone definer contacts the base and the heat sink.

24. A system, comprising:
    an optical device that includes an optical component on a base and one or more waveguides on the base;
    a heat sink; and
    a zone definer between the base and the heat sink such that the zone definer conducts thermal energy from the optical device to the heat sink,
        the zone definer including a thermal insulator having a lower thermal conductivity than both the heat sink and the base,
        the zone definer including a thermal via extending through the thermal insulator and being located under the optical component such that a line that is perpendicular to an upper surface of the heat sink can extend through the thermal via and the optical component,
        a via medium being positioned in the thermal via and having a higher thermal conductivity than the thermal insulator, and
        the optical component including a gain medium that is included in a laser cavity and generating thermal energy that is injected into the base during operation of the optical component.

25. A system, comprising:
    an optical device that includes optical components on a base and one or more waveguides on the base;
    a heat sink; and
    a zone definer between the base and the heat sink such that the zone definer conducts thermal energy from the optical device to the heat sink,
        the zone definer including a thermal insulator having a lower thermal conductivity than both the heat sink and the base,
        the zone definer including a thermal via extending through the thermal insulator and being located under one of the optical components such that a line that is perpendicular to an upper surface of the heat sink can extend through the thermal via and the optical component under which the thermal via is positioned,
        a via medium being positioned in the thermal via and having a higher thermal conductivity than the thermal insulator,
        a back cavity that extends from a bottom side of the base up into the base where a top side of the base is between the bottom side of the base and the optical components,
        the back cavity being located under one or more of the optical components such that for each of the one or more optical components under which the back cavity is located a second line that is perpendicular to a surface of the base can extend through the back cavity and through the component included in the one or more optical components.

26. The system of claim 25, wherein at least one of the one or more components under which the back cavity is located is a temperature sensitive component in that the performance of the temperature sensitive component changes in response to a change in the temperature of the temperature sensitive component.

27. The system of claim 26, wherein the thermal insulator is positioned between the temperature sensitive component and the heat sink such that a fifth line that is perpendicular to a surface of the heat sink can extend through the thermal insulator and the temperature sensitive component.

28. The system of claim 26, wherein the optical device includes one or more heaters positioned so as to heat the temperature sensitive component and the back cavity is positioned under the one or more heaters, the back cavity being located under the one or more heaters such that for each of the one or more heaters a fourth line that is perpendicular to a surface of the base can extend through the back cavity and through the heater included in the one or more heaters.

29. The system of claim 25, wherein the back cavity is not positioned under the one or more optical components under which the thermal via is positioned.

30. The system of claim 25, wherein the medium inside the back cavity is air.

31. The system of claim 25, wherein a medium inside the back cavity has a thermal conductivity that is less than the thermal conductivity of the base.

32. The system of claim 25, wherein the zone definer contacts the base and the heat sink.

33. A system, comprising:

an optical device that includes optical components on a base and one or more waveguides on the base;

a heat sink; and a zone definer between the base and the heat sink such that the zone definer conducts thermal energy from the optical device to the heat sink, the zone definer including a thermal insulator having a lower thermal conductivity than both the heat sink and the base, the zone definer including a thermal via extending through the thermal insulator and being located under one of the optical components such that a line that is perpendicular to an upper surface of the heat sink can extend through the thermal via and the optical component under which the thermal via is positioned, a projection of the thermal via onto the optical component under which the thermal via is positioned has the thermal via surrounding the optical component under which the thermal via is, positioned, and a via medium being positioned in the thermal via and having a higher thermal conductivity than the thermal insulator.

34. The system of claim 33, wherein the component under which the thermal via is located generates thermal energy that is injected into the base during operation.

35. The system of claim 34, wherein the component under which the thermal via is located includes a gain medium included in a laser cavity.

36. The system of claim 33, wherein the zone definer contacts the base and the heat sink.

37. A system, comprising:

an optical device that includes optical components on a base and one or more waveguides on the base, the waveguides guide light signals between at least a portion of the optical components;

a heat sink; and a zone definer between the base and the heat sink such that the zone definer conducts thermal energy from the optical device to the heat sink, the zone definer including a thermal insulator having a lower thermal conductivity than both the heat sink and the base, the zone definer including a thermal via extending through the thermal insulator and being located under one of the optical components such that a line that is perpendicular to an upper surface of the heat sink can extend through the thermal via and the optical component under which the thermal via is positioned, a via medium being positioned in the thermal via and having a higher thermal conductivity than the thermal insulator.

38. The device of claim 37, wherein a projection of the thermal via onto the optical component under which the thermal via is positioned has the thermal via surrounding the optical component under which the thermal via is positioned.

* * * * *